(12) United States Patent
Lee

(10) Patent No.: US 12,209,012 B2
(45) Date of Patent: Jan. 28, 2025

(54) WAFER LEVEL PACKAGE FOR DEVICE

(71) Applicant: Teknologian tutkimuskeskus VTT Oy, Espoo (FI)

(72) Inventor: Jae-Wung Lee, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 327 days.

(21) Appl. No.: 17/792,777

(22) PCT Filed: Jan. 25, 2021

(86) PCT No.: PCT/FI2021/050044
§ 371 (c)(1),
(2) Date: Jul. 14, 2022

(87) PCT Pub. No.: WO2021/148722
PCT Pub. Date: Jul. 29, 2021

(65) Prior Publication Data
US 2023/0050181 A1   Feb. 16, 2023

(30) Foreign Application Priority Data
Jan. 24, 2020  (FI) ..................................... 20205075

(51) Int. Cl.
*B81B 7/00* (2006.01)
*B81C 1/00* (2006.01)

(52) U.S. Cl.
CPC ........ *B81B 7/0038* (2013.01); *B81C 1/00269* (2013.01); *B81C 1/00285* (2013.01); *B81C 1/00301* (2013.01); *B81B 2207/093* (2013.01); *B81C 2203/0118* (2013.01); *B81C 2203/019* (2013.01)

(58) Field of Classification Search
None
See application file for complete search history.

(56) References Cited

U.S. PATENT DOCUMENTS

| 8,736,039 B2 * | 5/2014 | Wu ........................ H01L 23/585 |
| | | 257/723 |
| 2002/0179921 A1 * | 12/2002 | Cohn ..................... B81B 7/0051 |
| | | 257/E33.056 |

(Continued)

FOREIGN PATENT DOCUMENTS

| EP | 1967489 A2 | 9/2008 |
| JP | S5685955 A | 7/1981 |

(Continued)

OTHER PUBLICATIONS

JP2005528782A, WO03088347A2.
JP2009516365A, WO2007054524A1.

*Primary Examiner* — Benjamin P Sandvik
(74) *Attorney, Agent, or Firm* — Laine IP Oy

(57) ABSTRACT

According to an example aspect of the present invention, there is provided a wafer level package for a device, the package comprising: a first substrate and a second substrate, a sealing structure comprising a seal ring and a bonding layer between the first substrate and the second substrate, and a lateral electrical connection line on a surface of the first substrate, which lateral electrical connection line extends through the seal ring for creating an electrical connection between the device inside the package and an electrical circuit outside the package.

20 Claims, 7 Drawing Sheets

(56) References Cited

U.S. PATENT DOCUMENTS

| | | | |
|---|---|---|---|
| 2007/0105370 A1* | 5/2007 | Kinderknecht | B81C 1/00269 |
| | | | 257/E21.548 |
| 2009/0029526 A1 | 1/2009 | Chang-Chien et al. | |
| 2012/0280409 A1* | 11/2012 | Trautmann | H01L 23/10 |
| | | | 438/455 |
| 2012/0319220 A1* | 12/2012 | Noda | B23K 20/023 |
| | | | 257/E21.705 |
| 2019/0084826 A1 | 3/2019 | Singh et al. | |
| 2019/0348336 A1* | 11/2019 | Katkar | H01L 24/80 |

FOREIGN PATENT DOCUMENTS

| | | |
|---|---|---|
| JP | 2005528782 A | 9/2005 |
| JP | 2009516365 A | 4/2009 |
| WO | WO0073090 A1 | 12/2000 |
| WO | WO03088347 A2 | 10/2003 |
| WO | WO2007054524 A1 | 5/2007 |
| WO | WO2012171663 A1 | 12/2012 |

* cited by examiner

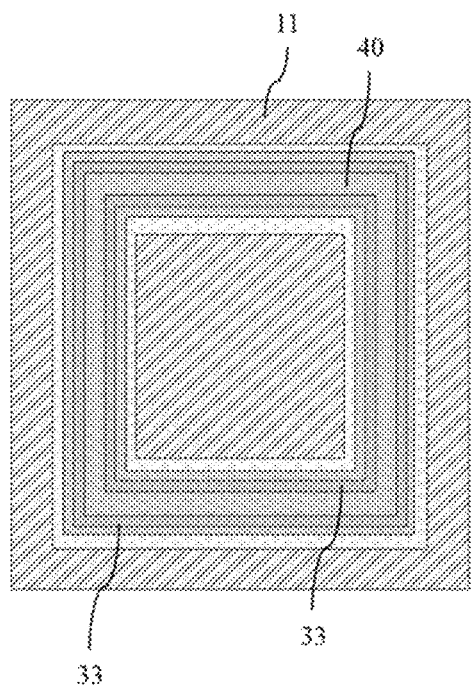
FIG. 8
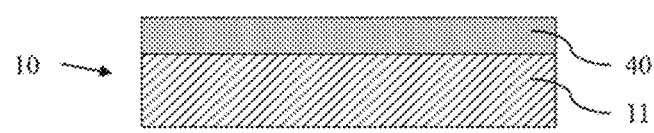
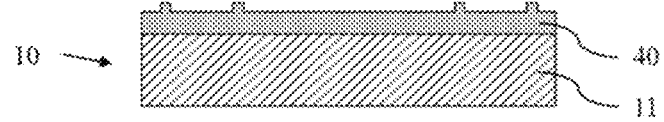
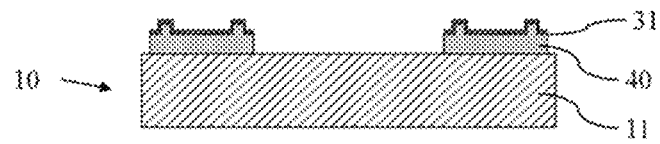

WAFER LEVEL PACKAGE FOR DEVICE

FIELD

The invention relates to a wafer level package for a device, in particular to a wafer level package for microelectromechanical systems (MEMS).

BACKGROUND

Microelectromechanical systems (MEMS) are miniaturized mechanical and electro-mechanical elements, such as devices and structures that are made using the techniques of microfabrication. MEMS are comprised of components between 1 and 100 micrometers in size and MEMS devices generally range in size from 20 micrometers to a millimeter.

Due to their small size, composition and extremely demanding manufacturing methods, MEMS devices are susceptible to electrical failures and mechanical damages. Therefore, MEMS devices need to be packaged, for example by sealing the device between two wafers connected by a seal ring. Non-uniformity of bonding temperature and bonding force used in bonding the two wafers together may cause low quality of MEMS. Due to non-uniform melting near eutectic temperature and bonding force, excessive squeezing of bonding material out from a seal ring area of MEMS may occur. This may lead to void formation and variation in gap dimensions between wafers. In addition, generally used bonding techniques provide only a small process window and may cause bonding misalignments. Moreover, electrical connection is generally formed by a difficult and complex structure by pads inside and outside packaging.

Thus, there is need for improved structures and manufacturing methods of a sealing structure of a wafer packaging.

SUMMARY OF THE INVENTION

The invention is defined by the features of the independent claims. Some specific embodiments are defined in the dependent claims.

According to a first aspect of the present invention, there is provided a wafer level package for a device, the package comprising: a first substrate and a second substrate, a sealing structure comprising a seal ring and a bonding layer between the first substrate and the second substrate, and a lateral electrical connection line on a surface of the first substrate, which lateral electrical connection line extends through the seal ring for creating an electrical connection between the device inside the package and an electrical circuit outside the package. The package comprises a plurality of micro-rings within the seal ring, wherein at least a portion of the material of the bonding layer is located between the micro-rings.

According to one embodiment of the present invention, the bonding layer is on a surface of the second substrate.

According to one embodiment of the present invention, the micro-rings are formed by protrusions on the surface of the seal ring.

According to one embodiment of the present invention, the seal ring comprises dielectric material.

According to one embodiment of the present invention, the package comprises a micro-ring pattern on the first substrate.

According to a second aspect of the present invention, there is provided a method for forming a wafer level package for a device comprising: making a lateral electrical connection line on a surface of a first substrate, making a seal ring on the surface of the first substrate and over a portion of the lateral electrical connection line, making a first bonding material layer on a surface of the seal ring, making a second bonding material layer on a surface of a second substrate, and bonding the first bonding material layer with the second bonding material layer to form a bonding layer, wherein the lateral electrical connection line extends through the seal ring for creating an electrical connection between the device inside the package and an electrical circuit outside the package. The method comprises providing of a plurality of micro-rings within the seal ring to confine at least a portion of the material of the bonding layer between the micro-rings when said material melts during the bonding process.

According to one embodiment of the present invention, bonding the first bonding material layer with the second bonding material layer is provided by eutectic bonding, transient liquid phase bonding or glass frit wafer bonding.

According to one embodiment of the present invention, the wafer level package is for a MEMS device.

The present invention provides several advantages. The invention provides a lateral electrical connection line, which extends through a seal ring for creating an electrical connection between a device inside a package and an electrical circuit outside the package. Moreover, a squeezing control of a bonding layer between bonding substrates, such as germanium-aluminum alloy melt, is provided by micro-rings. In addition, the micro-rings increase process window in the bonding of the substrates, especially in eutectic bonding of the substrates. The micro-rings also provide a precise gap due to a precise height of the micro-rings, which gap is free from temperature and pressure non-uniformities, such as voids. The invention provides a good and uniform bonding strength for a wafer level package. The invention also reduces slip misalignment between the bonding substrates due to local indentation and increased friction, hence improving bonding quality.

BRIEF DESCRIPTION OF THE DRAWINGS

FIG. 8 illustrates a top view of a micro-ring structure in accordance with at least some embodiments of the present invention;

FIGS. 9A-9D illustrate a manufacturing method of a first structure in accordance with at least some embodiments of the present invention;

EMBODIMENTS

In the present context, the term "substrate" comprises a wafer, such as a MEMS device wafer and a cap wafer.

The object of at least of some embodiments of the present invention is to provide a high quality wafer level package, especially for a microelectromechanical systems (MEMS) device, which sealing structure provides good electrical connection and precise gap control free from temperature and pressure non-uniformities, such as voids.

Figure 1:
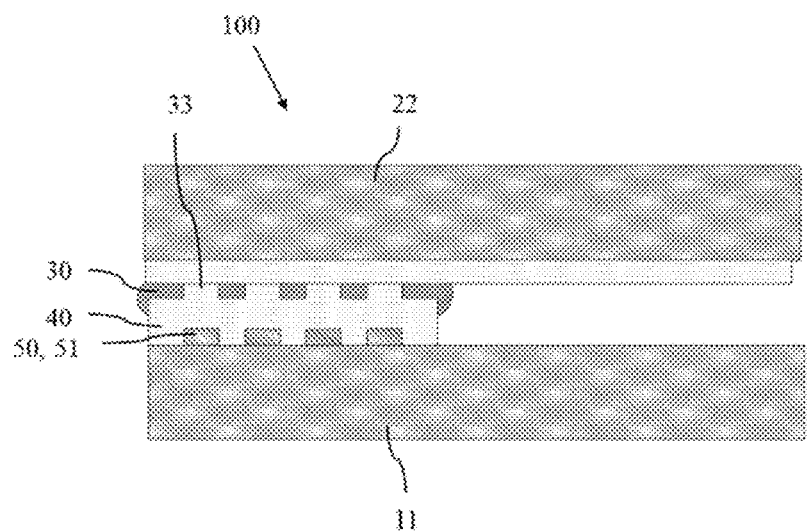
FIG. 1 illustrates a part of a seal ring in a wafer level package in accordance with at least some embodiments of the present invention.

FIG. 1 illustrates a part of a wafer level package 100 for a device according to some embodiments. The wafer level package 100 for a device comprises: a first substrate 11 and a second substrate 22, a sealing structure comprising a seal ring 40 and a bonding layer 30 between the first substrate 11 and the second substrate 22, and a lateral electrical connection line 50 and/or dummy line 51 on a surface of the first substrate 11, which lateral electrical connection line 50 extends through the seal ring 40 for creating an electrical connection between the device inside the package and an electrical circuit outside the package. Thus, electrical connection is formed by simple and reliable structure. In an embodiment, the lateral electrical connection line 50 and the dummy line 51 have a same composition but the difference is in the pattern and location as well as in the purpose of the structures. Whereas the lateral electrical connection line 50 is for creating electrical contact between the device inside the packages and external circuitry outside the package, the dummy lines 51 are there to equalize the surface under the seal ring 40 and around the lateral electrical connection line 50 so that the thickness of the seal ring 40 is easier to control.

Figure 2:
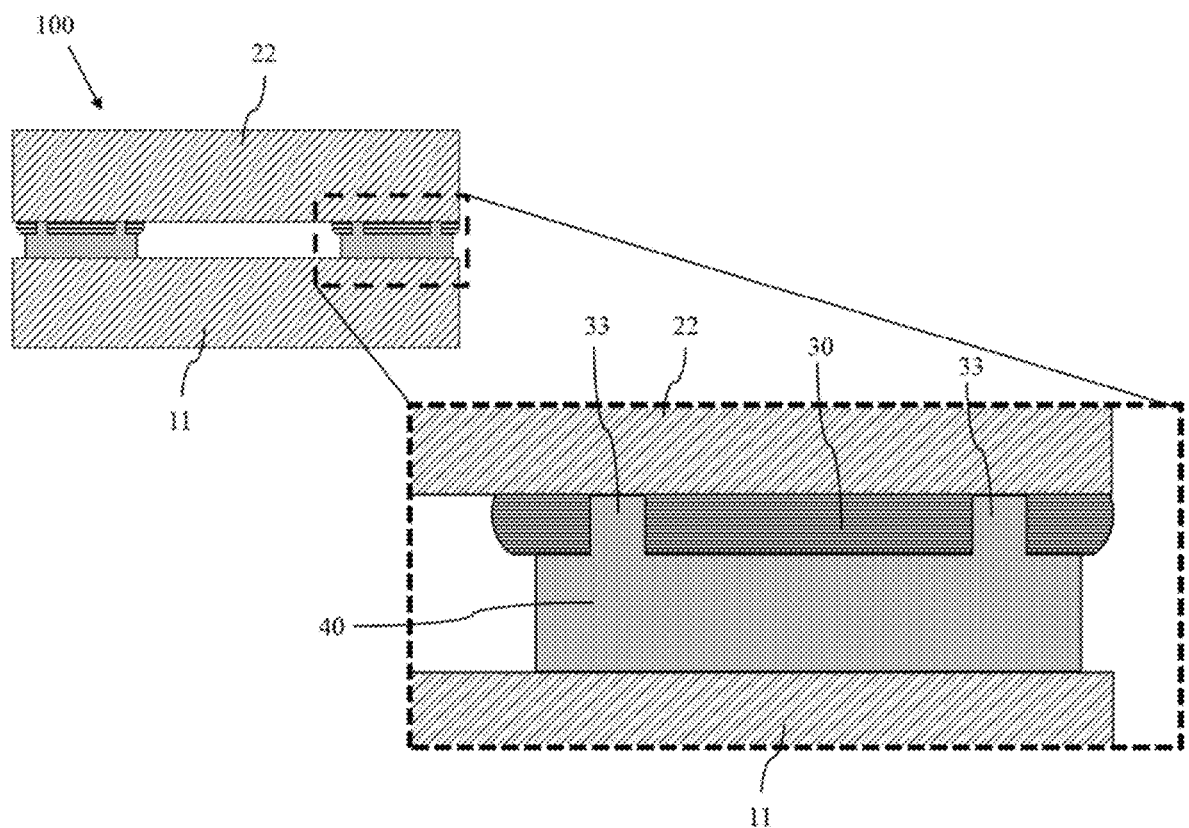
FIG. 2 illustrates a part of a seal ring in a wafer level package for a device in accordance with at least some embodiments of the present invention.
Figure 3:
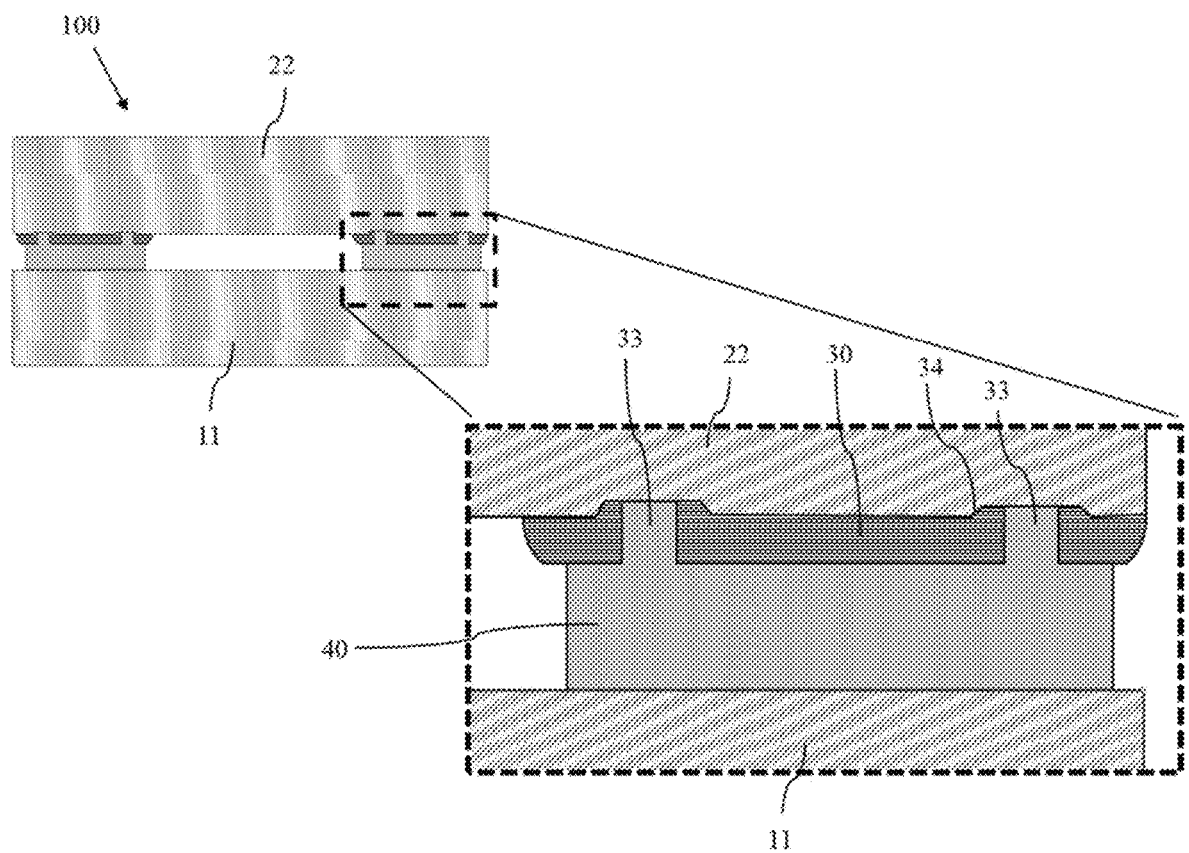
FIG. 3 illustrates a part of a seal ring in a wafer level package for a device in accordance with at least some embodiments of the present invention.

FIGS. 1-3 illustrate that the wafer level package 100 for a device comprises a bonding layer 30 on a surface of the second substrate 22. The bonding layer 30 enables bonding of the first substrate 11 and the second substrate 12 of the wafer lever package 100 together.

According to some embodiments, the bonding layer 30 comprises a eutectic alloy. The eutectic alloy can comprise two or more metals. Suitable eutectic alloys include, for example, germanium-aluminum, gold-tin, gold-germanium, gold-silicon, gold-indium or copper-tin alloy.

According to some other embodiments, the bonding layer 30 is an inter-metallic compound bonding layer. The inter-metallic compound bonding layer can comprise metal alloy, such as copper-tin, gold-indium or silver-tin alloy.

Alternatively, the bonding layer 30 can be a glass frit wafer bonding layer. Glass frit bonding has a high tolerance to surface roughness and can incorporate high topography of the substrates.

FIGS. 1-3 illustrate that the package 100 comprises a plurality of micro-rings 33, such as two, three, four or more, within the seal ring 40. The micro-rings confine material, such as metal melt, of the bonding layer 30 between micro-rings by pinch-off effect and provide controlled horizontal squeezing of the material of the bonding layer 30 outside the micro-rings. The micro-rings also provide precise gap control due to precise height of the micro-rings. The micro-rings provide the gap which is free from temperature and pressure non-uniformities, such as voids, due to uniform flowing of the bonding material to the gap. The bonding layer can extend all way on the surface of the second substructure (not illustrated). In addition, the micro-rings increases process window of bonding. Moreover, they reduce slip misalignment between the first substrate and the second substrate due to local indentation and increased friction.

According to some embodiments, the micro-rings 33 are formed by protrusions on the surface of the seal ring 40. The micro-rings 33 can be formed by continuous rings extending on the surface of the seal ring 40. The micro-rings 33 can thus extend around the cavity.

Figure 4:
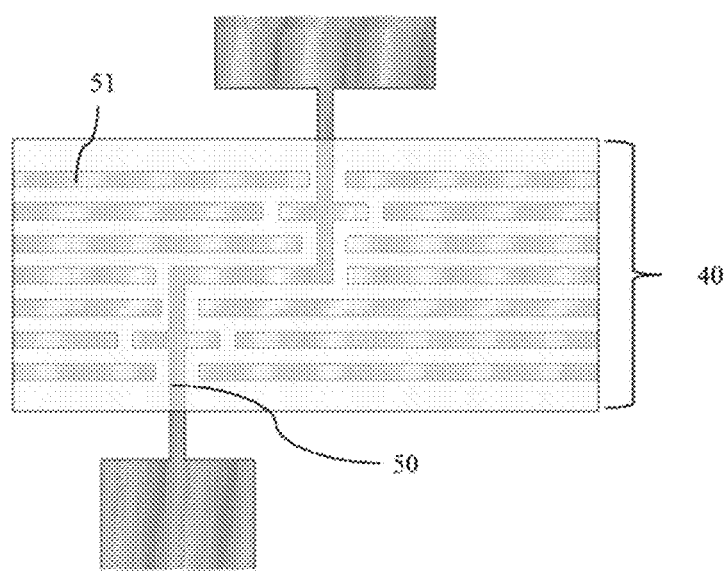
FIG. 4 illustrates a top view of a part of a seal ring structure in accordance with at least some embodiments of the present invention.

FIG. 4 illustrates a top view of a seal ring structure according to some embodiments. A width of the seal ring in a cross-sectional direction can be for example, 40-300 µm, such as 60-100 µm. The lateral electrical connection line 50 extends through the seal ring 40 outside the wafer level package. A width of the lateral electrical connection line 50 can be for example, 5-30 µm, such as 10-20 µm. The lateral electrical connection line 50 enables an electrical connection between the device inside the package and an electrical circuit outside the package.

FIG. 4 further illustrates that the dummy lines 51 are provided within the seal ring. The dummy lines equalize the surface under the seal ring 40. The width of the dummy lines 50 can be for example, 1-20 µm, such as 2-5 µm. The spacing between the dummy lines 51 as well as between the lateral electrical connection line 50 and the dummy lines 51 can be for example, 2-20 µm, such as 3-10 µm. The thickness of the lateral electrical connection line 50 and the dummy lines 51 can be for example, 0.2-5 µm, such as 0.5-1 µm.

FIG. 3 illustrates that the package 100 comprises a micro-groove 34 in the second substrate 22. The micro-groove enables aligning the micro-ring 33 to the second substrate 22.

Figure 5:
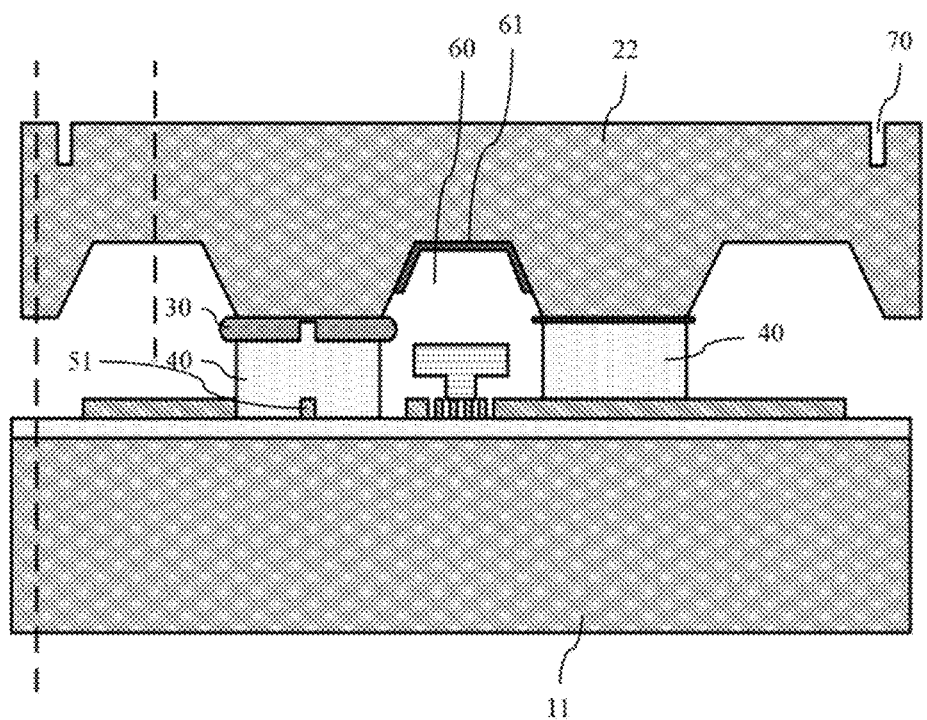
FIG. 5 illustrates a wafer level package for a device in accordance with at least some embodiments of the present invention.

FIG. 5 illustrates that the package 100 comprises a cavity 60 in the second substrate 22.

In addition, FIG. 5 illustrates that the package 100 comprises a getter 61 on a surface of the cavity 60. The getter can be used to create and maintain vacuum. The getter can be a thin film getter. The getter absorbs some or all of the gases anticipated to outgas into the cavity, such as water vapour, oxygen, carbon monoxide, carbon dioxide, nitrogen, hydrogen and/or other gases.

In an embodiment, the first substrate 11 and the second substrate 22 comprise silicon or ceramic. Silicon is very reliable substrate material as it suffers very little fatigue and can have long service lifetimes without breaking. In single crystal form, silicon has virtually no hysteresis and hence almost no energy dissipation. Suitable ceramic substrates are, for example, silicon nitride, aluminium nitride, titanium nitride or silicon carbide. Aluminum nitride in the wurtzite structure shows pyroelectric and piezoelectric properties, which enables to produce sensors for example, with sensitivity to normal and shear forces. Titanium nitride exhibits a high electrical conductivity and large elastic modulus.

According to an embodiment, the lateral electrical connection line 50 and the dummy lines 51 comprise metal, such as molybdenum, aluminum or copper. These metals enable good and reliable electrical connection in the lateral electrical connection line between the device inside the package and the electrical circuit outside the package.

According to an embodiment, the seal ring 40 comprises dielectric material, ceramic material or metal covered with insulation layer. The seal ring can comprise for example, silicon dioxide ($SiO_2$), aluminum nitride (AlN), aluminium oxide ($Al_2O_3$), silicon nitride ($Si_3N_4$), silicon carbide (SiC) or aluminium oxide ($Al_2O_3$) coated copper or nickel. Silicon dioxide provides a good wetting surface for the bonding layer 30 and a good electric insulation.

The micro-rings 33 can comprise, or be formed of, the same material than the seal ring 40, such as silicon dioxide ($SiO_2$), aluminum nitride (AlN), aluminium oxide ($Al_2O_3$), silicon nitride ($Si_3N_4$), silicon carbide (SiC) or aluminium oxide ($Al_2O_3$) coated copper or nickel.

According to an embodiment, the getter comprises metals that easily absorb gas. For example, the getter can comprise at least one of the following: titanium, aluminum, zirconium, boron, cobalt, calcium, strontium or thorium.

According to an embodiment, the package 100 comprises a micro-ring pattern 90 on the first substrate 11. The micro-ring pattern 90 can comprise for example, silicon (Si), silicon dioxide ($SiO_2$), metal or semiconductor material. The micro-ring pattern 90 confines material of the seal ring 40 between micro-rings by pinch-off effect. The micro-ring pattern also provides precise gap control due to precise height of the micro-ring pattern.

Alternatively, the dummy lines 51 can form the micro-ring pattern 90.

Figure 6A:
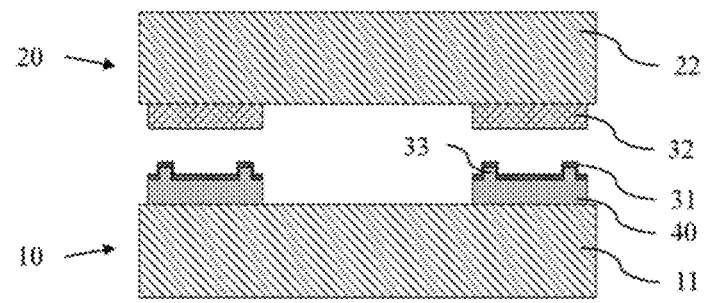
FIGS. 6A and 6B illustrate a method for forming a wafer level package for a device in accordance with at least some embodiments of the present invention.
Figure 6B:
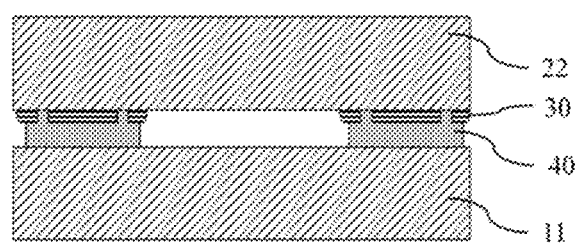

FIGS. 6A and 6B illustrate that a method for forming a wafer level package 100 for a device comprises a method for forming a wafer level package 100 for a device comprising making a lateral electrical connection line 50 (not shown in FIGS. 6A and 6B) on a surface of a first substrate 11, making a seal ring 40 on the surface of the first substrate 11 and over a portion of the lateral electrical connection line 50, making a first bonding material layer 31 on a surface of the seal ring 40, making a second bonding material layer 32 on a surface of a second substrate 22, and bonding the first bonding material layer 31 with the second bonding material layer 32 to form a bonding layer 30. The lateral electrical connection line 50 extends through the seal ring 40 for creating an electrical connection between the device inside the package 100 and an electrical circuit outside the package 100.

A deposition of layers of the wafer level package 100, such as a first bonding material layer 31 and the second bonding material layer 32, can be conducted by a deposition process. The deposition process can comprise for example, physical vapor deposition (PVD) or chemical vapor deposition (CVD).

Thickness of the first bonding material layer 31 and the second material layer 32 can be for example, 0.3-0.8 μm, such as 0.4-0.7 μm each. Also the thickness on the micro-ring 33 can be for example 0.3-0.8 μm, such as 0.4-0.7 μm.

According to some embodiments, bonding the first bonding material layer 31 with the second bonding material layer 32 is provided by eutectic bonding. First, temperature can be raised to a value lower than the eutectic temperature of the eutectic alloy. Then, temperature can be maintained constant for short time to reach uniform heating of both first substrate and second substrate. After that, temperature can be increased to a temperature exceeding the eutectic point. Finally, the structure can cool down to a temperature below the eutectic temperature.

Eutectic bonding does not require use of high contact force during the bonding. Eutectic bonding is less sensitive to surface flatness irregularities, scratches, as well as to particles compared to the direct wafer bonding methods, because the eutectic bonding process goes through a liquid phase.

According to some embodiments, eutectic bonding is conducted 10-20° C. above eutectic temperature of a eutectic alloy. Aluminum-germanium bonding can be conducted for example, at 390° C. Gold-tin bonding can be conducted for example, at 290° C. Gold-silicon bonding can be conducted for example, at 375° C. Gold-germanium bonding can be conducted for example, at 435° C.

Alternatively, bonding the first bonding material layer 31 with the second bonding material layer 32 can be provided by transient liquid phase bonding. Transient liquid phase bonding results in an inter-metallic compound bonding layer. This advanced type of solder bonding process can form high-quality hermetic seals at lower temperatures than other bonding technologies. Transient liquid phase bonding uses one thin layer of metal (typically 1-10 μm thick) which during a thermal process diffuses into its bonding partner forming an inter-metallic compound layer with re-melting temperature higher than the bonding temperature. The inter-metallic compound bonding layer can be formed by using lower bonding temperatures than the bonding temperatures of the most usual eutectic alloys. Thus, the inter-metallic compound bonding layer can be used in applications where lower producing temperatures are needed.

Transient liquid phase bonding can be conducted in a same manner than eutectic bonding: first, temperature can be raised to a value lower than a bonding temperature. Then, temperature can be maintained constant for short time to reach uniform heating of both first substrate and second substrate. After that, temperature can be increased to a temperature exceeding the bonding temperature. Finally, the structure can cool down to a temperature below the bonding temperature.

According to some embodiments, transient liquid phase bonding can be conducted at temperature of 150-300° C.

Alternatively, bonding the first bonding material layer 31 with the second bonding material layer 32 can be provided by glass frit wafer bonding. Glass frit wafer bonding uses as intermediate layer for bonding a low melting point glass. The bond occurs by heating the substrates with applied contact force.

Bonding can be conducted in a bonding chamber. A controlled vacuum pressure can be formed in the bonding chamber. The vacuum pressure can be for example, $0.8 \; 10^{-5}$ mbar. One or more inert gases, such as argon and nitrogen, can be introduced to the bonding chamber.

FIG. 9A illustrates that the seal ring 40 can be deposited on the first substrate 11. Thickness of the seal ring 40 can be for example, 0.3-1 μm, such as 0.4-0.6 μm.

According to some embodiments, the method can comprise providing of a plurality of micro-rings 33 within the seal ring 40. The micro-rings can be provided within the seal ring by patterning of the seal ring as illustrated in FIG. 9B. The micro-rings confine at least a portion of the material of the bonding layer 30 between the micro-rings 33.

Figure 7A:
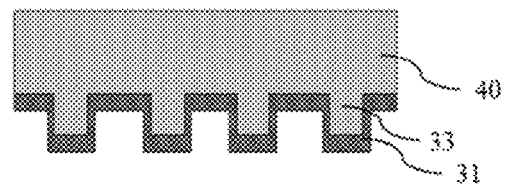
FIGS. 7A-7C illustrate a cross-sectional view of the micro-ring designs in accordance with at least some embodiments of the present invention.
Figure 7B:
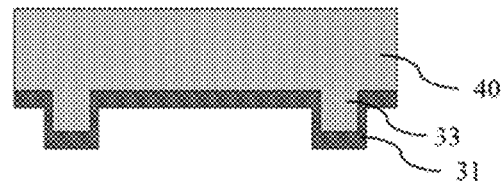
Figure 7C:
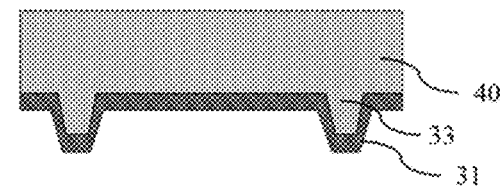

FIGS. 7A-7C illustrate a cross-sectional view of the micro-ring 33 designs according to some embodiments. The micro-rings are provided within the seal ring 40. A first bonding material layer 31 is provided on the seal ring 40 and the micro-rings 33. A height of the micro-ring can be for example, 0.5 μm. A width of a gap between the micro-rings and form of the micro-rings can be selected for example, according to preferred properties of the sealing structure or process parameters.

FIG. 8 illustrates a top view of a micro-ring 33 structure according to some embodiments. A plurality of micro-rings 33, such as two, can be provided within the seal ring 40. A width of the micro-ring can be for example, 0.5 to 15 μm.

According to some embodiments, the method can comprise depositing an oxide layer. The oxide layer can be deposited on for example, the first substrate 11, the second substrate 22, the first bonding material layer 31, the second material layer 32, the seal ring 40 and the lateral electrical connection line 50. The oxide layers can be grown by thermal oxidation in which a layer is exposed to oxygen and/or steam to grow a thin surface layer on the layer. The oxide layers of the (typically silicon) the first substrate 11 and the second substrate 22 can comprise silicon dioxide ($SiO_2$). The oxide layers prevent the layers of the wafer level package from oxidation.

Figure 10A:
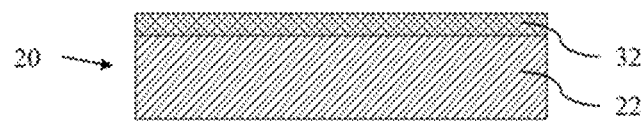
FIGS. 10A and 10B illustrate a manufacturing method of a second structure in accordance with at least some embodiments of the present invention.
Figure 10B:
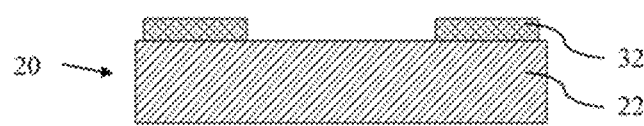

FIGS. 9B, 9D and 10B illustrate that according to some embodiments, the method comprises patterning of the seal ring 40, the oxide layer, the first material layer 31 and/or the second material layer 32. Patterning can be used for removing areas from the layers of the wafer level package. Patterning can be conducted by lithography, electron beam lithography, ion beam lithography, ion track technology, X-ray lithography or diamond patterning.

According to some embodiments, the method comprises removing of oxide layers before bonding of the first bonding material layer 21 and the second bonding material layer 22 before bonding the first bonding material 31 layer with the second bonding material layer 32. The oxide layers can be removed for example, by plasma cleaning, wet chemical etching or dry chemical etching.

Figure 12A:
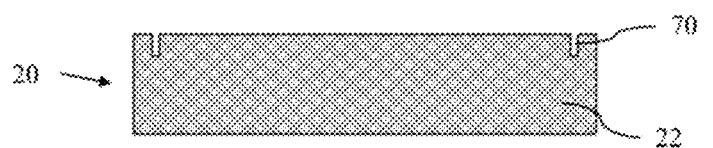
FIGS. 12A-12E illustrate a manufacturing method of a second structure in accordance with at least some embodiments of the present invention.
Figure 12B:
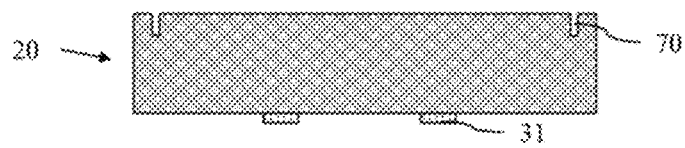
Figure 12C:
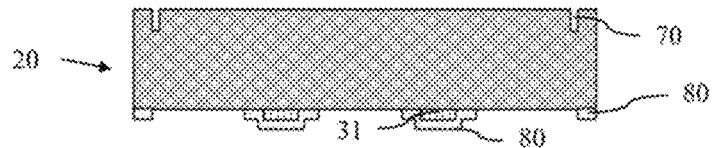
Figure 12D:
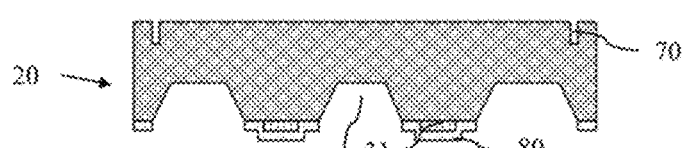

FIG. 12D illustrates that according to some embodiments, the method comprises forming of a cavity 60 in the second substrate 22. The cavity can be formed by for example, silicon wet or dry etching.

According to some embodiments, the method comprises forming a getter 61 on the cavity 60 in the second substrate 22. The getter 61 can be formed by getter deposition process. The getter can be deposited for example, by using sputtering, resistive evaporation, e-beam evaporation or other suitable deposition technique.

The method for forming the sealing structure of the wafer packaging for a device will now be discussed in more detail by means of example embodiments.

FIGS. 9A-9D illustrates a manufacturing method of a first structure 10 according to some embodiments. First, the lateral electrical connection line 50 and the dummy lines 51 can be provided on a surface of the first substrate 11 (not illustrated). Then, a seal ring 40 can be deposited on the lateral electrical connection line 50 and the dummy lines 51 as illustrated in FIG. 9A. The seal ring 40 can be patterned as illustrated in FIG. 9B. After that, a first bonding material layer 31 can be deposited on the seal ring as illustrated in FIG. 9C. Finally, the seal ring layer and the first bonding material layer can be patterned as illustrated in FIG. 9D.

FIGS. 10A and 10B illustrate a manufacturing method of a second structure 20 according to some embodiments. First, a second bonding material layer 32 is deposited on a second substrate 22 as illustrated FIG. 10A. Then, the second bonding material layer is patterned as illustrated FIG. 10B.

Figure 11A:
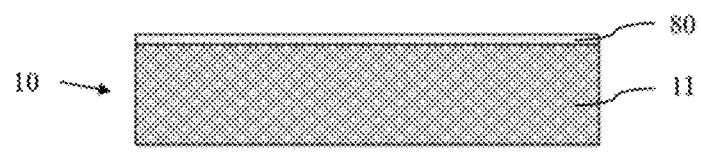
FIGS. 11A-11C illustrate a manufacturing method of a first structure in accordance with at least some embodiments of the present invention.
Figure 11B:
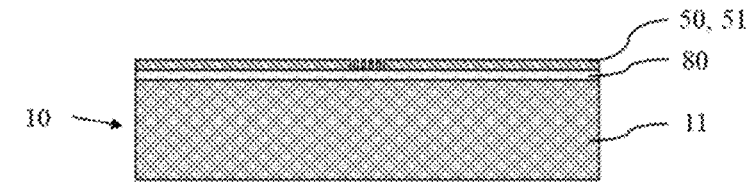
Figure 11C:
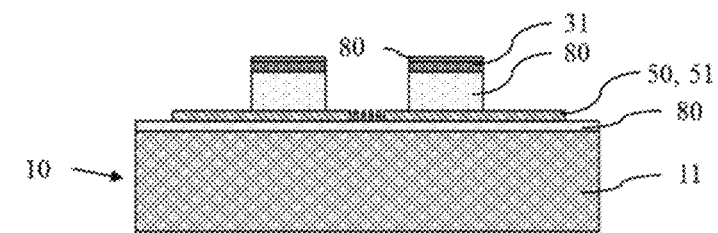

FIGS. 11A-11B illustrate a manufacturing method of a first structure 10 according to some embodiments of the present invention. First, an oxide layer 80, such as silicon oxide ($SiO_2$), is generated on a first substrate 11 as illustrated in FIG. 11A. Then, the lateral electrical connection line 50 and the dummy lines 51 is provided on the oxide layer (FIG. 11B). After that, a metal or metal oxide layer 80, such as aluminum or aluminum oxide ($Al_2O_3$) layer, can be deposited on the lateral electrical connection line and the dummy lines 51 for preventing the lateral electrical connection line and the dummy lines 51 from oxidation. The first bonding material layer 31 can be deposited on the metal or metal oxide layer. A metal or metal oxide layer 80, such as aluminum or aluminum oxide ($Al_2O_3$) layer, is deposited on the first bonding material layer 31 as illustrated in FIG. 11C.

Figure 12E:
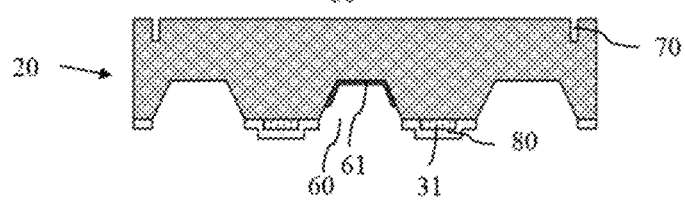

FIGS. 12A-12E illustrate a manufacturing method of a second structure 20 according to some embodiments. First, an align-mark 70 is generated on a back side of the second substrate 22 and chip numbering can be conducted (FIG. 12A). Then, the second bonding material layer 32 is provided on the second substrate 22, and the first bonding material layer is patterned as illustrated in FIG. 12B. After that, an oxide layer 80 can be deposited on the first bonding material layer 31. The oxide layer 80 can be patterned (FIG. 12C). The oxide layers 80 can be removed for example, by plasma cleaning, wet chemical etching or dry chemical etching before bonding. In addition, the cavity 60 can be formed in the second substrate 22 by silicon wet or dry etching (FIG. 12D). Finally and optionally, a getter 61 is deposited on a surface of the cavity 60 as illustrated in FIG. 12E.

Figure 13A:
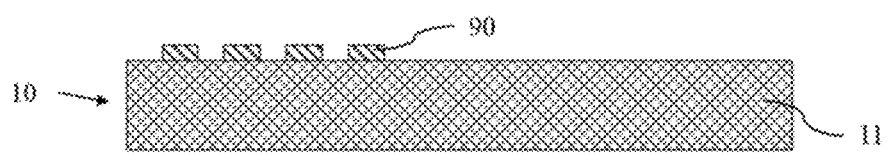
FIGS. 13A-13C illustrate a manufacturing method of a first structure in accordance with at least some embodiments of the present invention.
Figure 13B:
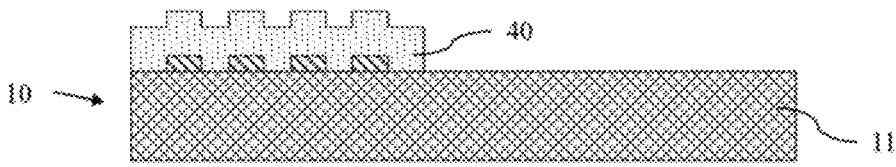
Figure 13C:
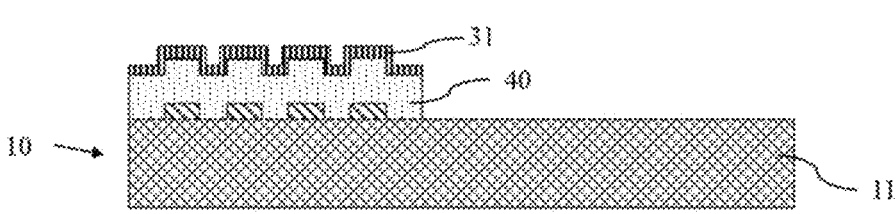

FIGS. 13A-13C illustrate a manufacturing method of a first structure 10 according to some embodiments of the present invention. First, the lateral electrical connection line 50 and optionally also the dummy lines 51 can be provided on a surface of a first substrate 11 (not illustrated). Then, a micro-ring pattern 90 is made on the first substrate 11 as illustrated in FIG. 13A. After that, a seal ring 40 is deposited on the micro-ring pattern 90 and the surface of the first substrate 11 and over a portion of the lateral electrical connection line 50 (FIG. 13B). The seal ring 40 reproduces the form of the micro-ring pattern 90. Finally, a first bonding material layer 31 can be deposited on the seal ring as illustrated in FIG. 13C.

Alternatively, the dummy lines 51 can form the micro-ring pattern 90.

According to some embodiments, the sealing structure is for a MEMS device. However, the sealing structure can be used in other devices, such as automotive devices, e.g. lidar components and tire pressure sensors, RF components, e.g. switches, filters, inductors and antennas, passive photonic devices, e.g. silicon wave guide and modulator, microspectrometer components and plasmonics devices.

According to at least some embodiments, the mechanical bond in formed exclusively by the bonding layer 30 such that the micro-rings 33 do not participate in forming the mechanical bond.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", i.e. a singular form, throughout this document does not exclude a plurality.

REFERENCE SIGNS LIST 10 first structure
11 first substrate
20 second structure
22 second substrate
30 bonding layer
31 first bonding material layer
32 second bonding material layer
33 micro-ring
34 micro-groove
40 seal ring
50 lateral electrical connection line
51 dummy line
60 cavity
61 getter
70 align mark
80 oxide layer
90 micro-ring pattern
100 wafer level package

The invention claimed is:

1. A wafer level package for a device, the package comprising:
   a first substrate and a second substrate,
   a sealing structure comprising a seal ring and a bonding layer between the first substrate and the second substrate, and
   a lateral electrical connection line on a surface of the first substrate, which lateral electrical connection line extends through the seal ring for creating an electrical connection between the device inside the package and an electrical circuit outside the package,
   wherein the package comprises a plurality of micro-rings within the seal ring, and wherein at least a portion of the material of the bonding layer is located between the micro-rings.

2. The wafer level package of claim 1, wherein the bonding layer is on a surface of the second substrate.

3. The wafer level package of claim 1, wherein the micro-rings are formed by protrusions on the surface of the seal ring.

4. The wafer level package of claim 1, wherein the seal ring comprises dielectric material.

5. The wafer level package of claim 1, wherein the package comprises a cavity in the second substrate.

6. The wafer level package of claim 5, wherein the package comprises a getter on a surface of the cavity.

7. The wafer level package of claim 1, wherein the package comprises a micro-ring pattern on the first substrate.

8. The wafer level package of claim 1, wherein the package is for a MEMS device.

9. A method for forming a wafer level package for a device comprising:
   making a lateral electrical connection line on a surface of a first substrate,
   making a seal ring on the surface of the first substrate and over a portion of the lateral electrical connection line,
   making a first bonding material layer on a surface of the seal ring,
   making a second bonding material layer on a surface of a second substrate, and
   bonding the first bonding material layer with the second bonding material layer to form a bonding layer,
   wherein the lateral electrical connection line extends through the seal ring for creating an electrical connection between the device inside the package and an electrical circuit outside the package, and
   wherein the method further comprises providing of a plurality of micro-rings within the seal ring to confine at least a portion of the material of the bonding layer between the micro-rings.

10. The method of claim 9, wherein the micro-rings are formed by protrusions on the surface of the seal ring.

11. The method of claim 9, wherein the seal ring comprises dielectric material.

12. The method of claim 9, wherein the method further comprises depositing an oxide layer on the first bonding material layer and the second material layer.

13. The method of claim 11, wherein the method further comprises patterning of the seal ring, the oxide layer, the first material layer and/or the second material layer.

14. The method of claim 9, wherein the method further comprises forming a cavity in the second substrate and a getter on the surface of the cavity by getter deposition process.

15. The method of claim 9, wherein bonding the first bonding material layer with the second bonding material layer is provided by eutectic bonding, transient liquid phase bonding or glass frit wafer bonding.

16. The method of claim 15, wherein eutectic bonding is conducted 10-20° C. above eutectic temperature of a eutectic alloy.

17. The method of claim 15, wherein transient liquid phase bonding is conducted at temperature of 150-300° C.

18. The method of claim 9, wherein the method further comprises providing a micro-ring pattern on the first substrate.

19. The method of claim 9, wherein the wafer level package is for a MEMS device.

20. The wafer level package of claim 2, wherein the micro-rings are formed by protrusions on the surface of the seal ring.

* * * * *